United States Patent [19]

Kida et al.

[11] Patent Number: 5,467,049
[45] Date of Patent: Nov. 14, 1995

[54] SOLID-STATE SWITCH

[75] Inventors: Junzo Kida, Hitachi; Hiroshi Arita, Mito; Yukio Kurosawa, Hitachi, all of Japan

[73] Assignee: Hitachi, Ltd., Tokyo, Japan

[21] Appl. No.: 91,623

[22] Filed: Jul. 15, 1993

[30] Foreign Application Priority Data

Sep. 18, 1992 [JP] Japan ................. 4-249934

[51] Int. Cl.⁶ ............. H03K 17/72; H03K 17/725
[52] U.S. Cl. ................. 327/438; 327/447; 327/448
[58] Field of Search .................... 307/248, 630, 307/633, 643, 645, 284; 327/419, 438, 440, 441, 447, 448, 460, 461, 193

[56] References Cited

U.S. PATENT DOCUMENTS 3,890,561  6/1975  Demarest ............... 307/645

FOREIGN PATENT DOCUMENTS 920218  1/1973  Canada .................. 307/645
150958  1/1979  Japan ................... 307/645
605295  4/1978  U.S.S.R. ............... 307/645

Primary Examiner—Steven Mottola
Assistant Examiner—Tiep H. Nguyen
Attorney, Agent, or Firm—Antonelli, Terry, Stout & Kraus

[57] ABSTRACT

A solid-state switch has a plurality of gate turn-off thyristors connected in the rungs of a ladder circuit and a plurality of diodes connected in the side rails of the ladder circuit. The anode of the first gate turn-off thyristor is connected to the cathodes of the first and second diodes, the cathode of the first gate turn-off thyristor is connected to the anodes of the third and fourth diodes. The cathode of the second gate turn-off thyristor is connected to the anode of the second diode and the anode of the fifth diode, the anode of the second gate turn-off thyristor is connected to the cathode of the fourth diode and the cathode of the sixth diode. The anode of the first diode and the cathode of the third diode are connected together at a common point, which is selected to be one terminal of the switch. The cathode of the fifth diode and the anode of the sixth diode or the anode of one and the cathode of the other one of the last two diodes of the ladder circuit are connected together at a common point, which is selected to be the other terminal of the switch.

33 Claims, 9 Drawing Sheets

FIG. IA
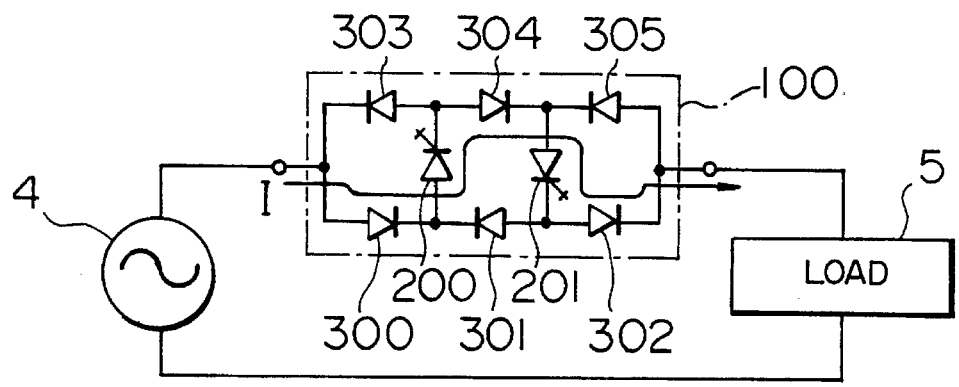
FIG. 2
(PRIOR ART)
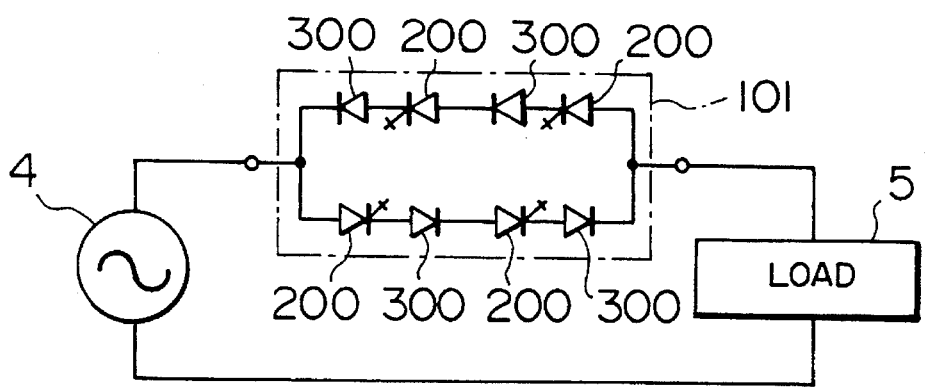
FIG. 3
(PRIOR ART)
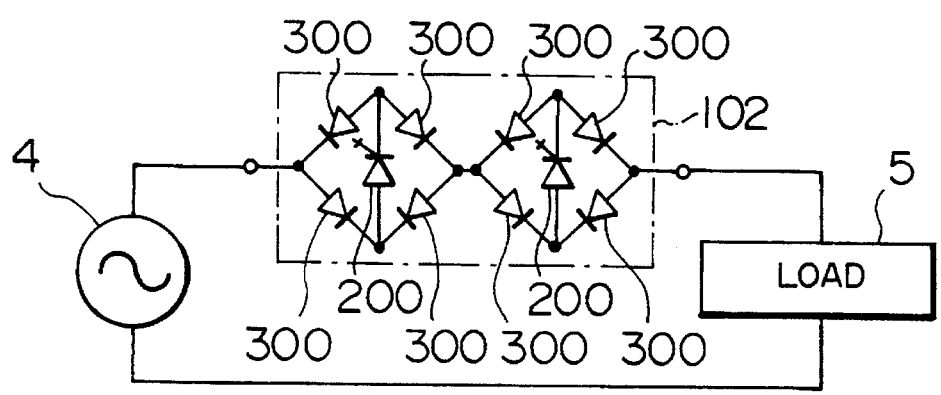

FIG. IB
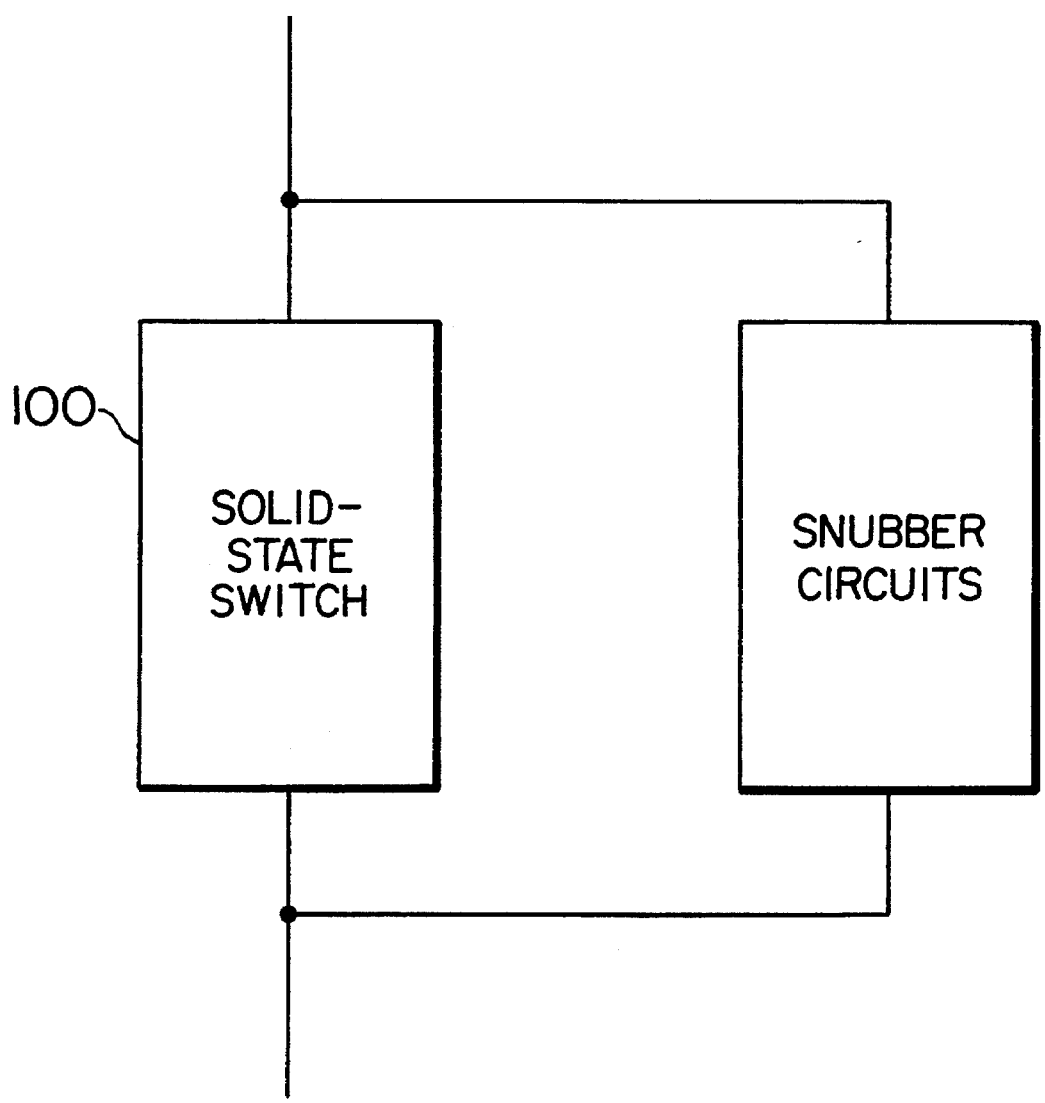

FIG. 6

| | THIS INVENTION | PRIOR ART 1 | PRIOR ART 2 |
|---|---|---|---|
| ARRANGEMENTS OF SOLID-STATE SWITCHES | | | |
| NUMBER OF GATE TURN OFF THYRISTORS | n | 2n | n |
| NUMBER OF DIODES | 2n + 1 | 2n | 4n |
| LOSS | 2n + 1 | 2n | 3n |

SOLID-STATE SWITCH

BACKGROUND OF THE INVENTION

The present invention relates to switches for controlling currents flowing in both directions such as alternating currents and, particularly, to a solid-state switch formed of semiconductor devices, such as gate turn-off thyristors, connected in series in order that the switch can be operated at a high voltage.

When a solid-state switch is used as, for example, a circuit breaker or, generally speaking, a switch gear in a power system, the solid-state switch must withstand a high voltage because the nominal voltage of the transmission lines is, for example, 3.3 kV through 500 kV, and because several times the system voltage is applied to the circuit breaker after current is cut off. However, a single semiconductor device cannot satisfactorily withstand this high voltage, and thus several semiconductor devices are required to be connected in series to increase the breakdown voltage of the switch. In addition, in the power system, an AC current must be flowing and be cut off.

When gate turn-off (GTO) thyristors are used to make a solid-state switch, diodes for protecting the GTO thyristors from the reverse voltage are necessary to be connected in series with the thyristors because the reverse breakdown voltage of the GTO thyristors is often much lower than the forward breakdown voltage. Some solid-state switches formed of these gate turn-off thyristors have been proposed for controlling the flow of alternating currents. In one of those switches, the gate turn-off thyristors of an arm for forward current and those of the other arm for reverse current are connected in an inverse-parallel (reverse-parallel) configuration. In another one of those switches, diodes are connected in a bridge configuration, and a gate turn-off thyristor is connected at the center of the bridge. Moreover, these solid-state switches as the basic circuit arrangements are connected in series in order to withstand a high voltage that will be applied when the solid-state switches are turned off.

SUMMARY OF THE INVENTION

Accordingly, it is an object of the invention to provide a solid-state switch which can be formed of a small number of gate turn-off thyristors and which does not greatly increase the current-flowing loss, or watt loss.

When a series circuit of gate turn-off thyristors 200 and diodes 300 for reverse voltage protection and another series circuit of gate turn-off thyristors 200 and diodes 300 are connected in an inverse-parallel (reverse-parallel) configuration as shown in FIG. 2 to form a high-voltage resistant solid-state switch with the forward breakdown voltage increased, two arms are necessary for controlling the forward current and reverse current. Thus the total number of gate turn-off thyristors used is increased to twice the number of gate turn-off thyristors used in a series circuit which is determined by the high voltage that is applied when the solid-state switch is turned off and by the set voltage across each of the gate turn-off thyristors. In the circuit arrangement shown in FIG. 2, two gate turn-off thyristors are connected in series to effectively increase the breakdown voltage to twice that of each thyristor. Thus, this solid-state switch has four gate turn-off thyristors and four diodes for reverse current protection. The current in each direction flows in the four semiconductor devices, so that the watt loss is increased the more. The gate turn-off thyristor is several times expensive as compared with the diode of the same size. Thus, since the number of gate turn-off thyristors used is twice that determined by the turn-off breakdown voltage of the solid-state switch, the number of drive circuits for the gate turn-off thyristors is increased so that the solid-state switch becomes large-sized and expensive. FIG. 3 shows a bridge-type solid-state switch in which the diodes 300 for reverse voltage protection are connected in a bridge configuration and in which the gate turn-off thyristor 200 is connected in the center of each bridge. In this circuit arrangement, the number of gate turn-off thyristors used is the same as the number of series-connected ones, determined by the high voltage that is applied when the solid-state switch is turned off and by the set voltage of each of the gate turn-off thyristors, but the number of diodes used is increased. Since the number of semiconductor devices used for flowing a current is flowed is increased 1.5 times that of the reverse-parallel connection type shown in FIG. 2, the semiconductor devices produce a large loss when currents are normally flowing in the devices. When two diode bridges, each of which has a gate turn-off thyristor connected in the center, are connected in series to form a solid-state switch having twice the breakdown voltage of each of the gate turn-off thyristors as, for example, shown in FIG. 3, two gate turn-off thyristors and eight diodes are necessary. In such a configured scheme, current flow in the solid-state switch is through six semiconductor devices in each direction, so that the watt loss is increased the more.

According to this invention, to solve the above problems, there is provided a solid-state switch having a plurality of gate turn-off thyristors connected equivalently in series between the switch terminals, wherein one of the adjacent gate turn-off thyristors has its anode connected through a diode to the cathode of the opposite one, the diodes connected between the adjacent gate turn-off thyristors have their anodes connected to the cathodes of the gate turn-off thyristors and their cathodes connected to the anodes of the gate turn-off thyristors, the gate turn-off thyristors adjacent to the terminals respectively have at least the cathodes thereof connected through diodes to the switch terminals, and the diodes connected between the cathodes of the gate turn-off thyristors adjacent to the switch terminals, and the switch terminals have their anodes connected to the cathodes of the gate turn-off thyristors and their cathodes connected to the switch terminals, respectively.

According to the solid-state switch of the invention mentioned above, the current (e.g. which flows from the anode of the diode to the cathode thereof) is flows from the anode of the gate thyristor to the cathode thereof, from the anode of the diode to the cathode thereof, from the anode of the other gate turn-off thyristor to the cathode thereof, and from the anode of the diode to the cathode thereof. In the reverse direction of the alternating current, current flow is similarly effected so that a solid-state switch has a plurality of gate turn-off thyristors connected equivalently in series between the terminals.

According to this invention, if two gate turn-off thyristors are used to constitute a solid-state switch, the solid-state switch is able to have twice the breakdown voltage of each gate turn-off thyristor in the off-state. In the prior art, in order to construct a solid-state switch having the same breakdown voltage in the off-state as above, four gate turn-off thyristors connected in series with diodes for reverse breakdown protection must be connected in a reverse-parallel configuration. In the invention, only two gate turn-off thyristors (which is ½ the number of gate turn-off thyristors in the prior art) may be connected to achieve the same solid-state switch.

In addition, the number of drive circuits necessary for the gate turn-off thyristors can be reduced to ½ that in the prior art, thus the solid-state switch can be reduced in size and produced at low cost. If the diodes for the reverse breakdown voltage protection are connected in a bridge configuration, and a gate turn-off thyristor is connected at the center of each bridge to form a solid-state switch, 8 diodes are necessary, and hence the watt loss in the semiconductor devices is six times that of each device. In this invention, 6 diodes may be used to achieve the same solid-state switch, and hence the watt loss in the semiconductor devices is reduced to five times that of each device.

According to the solid-state switch of the invention, the number of gate turn-off thyristors used can be reduced without greatly increasing the watt loss.

BRIEF DESCRIPTION OF THE DRAWINGS

FIG. 1A is a diagram of the arrangement of a basic solid-state switch of one embodiment of the invention, and FIG. 1B is illustrative of the necessary protection circuits coupled thereto.

FIG. 2 is a diagram of the arrangement of a conventional solid-state switch.

FIG. 3 is a diagram of the arrangement of another conventional solid-state switch.

FIG. 6 is a table of device number and loss for a solid-state switch of an embodiment of the invention and for conventional solid-state switches.

DESCRIPTION OF THE PREFERRED EMBODIMENTS

Figure 4:
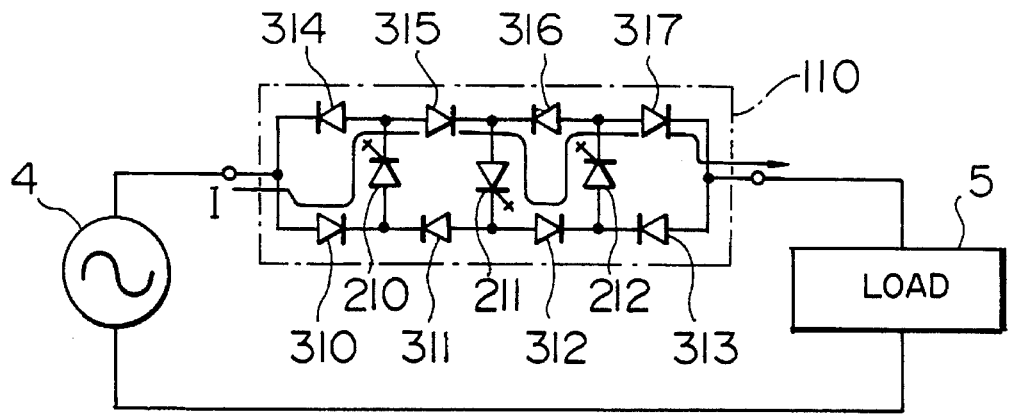
FIG. 4 is a diagram of the arrangement of a solid-state switch equivalent to the series connection of three gate turn-off thyristors as another embodiment of the invention.

One embodiment of the invention will be described with reference to FIG. 1A.

FIG. 1A is a diagram of the arrangement of a basic AC solid-state switch 100 for AC as one embodiment of the invention. The solid-state switch 100 is one of the numerous examples disclosed herein of a circuit breaker for a power system, or generally, a switch gear. In this embodiment, two gate turn-off thyristors and diodes are connected in forward and reverse directions as illustrated in FIG. 1A. In other words, the cathodes of first and second diodes 300, 301 are connected to the anode of a first gate turn-off thyristor 200, and the anodes of third and fourth diodes 303, 304 are connected to the cathode of the first gate turn-off thyristor 200. In addition, the anode of the second diode 301 and the anode of a fifth diode 302 are connected to the cathode of the second gate turn-off thyristor 201, and the cathode of the fourth diode 304 and the cathode of a sixth diode 305 are connected to the anode of the second gate turn-off thyristor 201. The anode of the first diode 300 is connected to the cathode of the third diode 303, and a terminal of the switch is led out from the junction therebetween. The cathode of the fifth diode 302 is connected to the anode of the sixth diode 305, and the other terminal of the switch is led out from the junction therebetween. Moreover, necessary protection circuits such as snubber circuits, shown in block form in FIG. 1B, are connected to the respective semiconductor devices of gate turn-off thyristors and diodes.

The operation of the solid-state switch 100 connected between a power source 4 and a load 5 will be described with reference to FIG. 1A. We now consider that the gate turn-off thyristors 200 and 201 are turned on so that the solid-state switch 100 is in the on-state. A current I flows, in one direction, through a circuit of the diode 300, the gate turn-off thyristor 200, the diode 304, the gate turn-off thyristor 201 and the diode 302 and, in the reverse direction, flows through a circuit of the diode 305, the gate turn-off thyristor 201, the diode 301, the gate turn-off thyristor 200 and the diode 303. When the gate turn-off thyristors 200, 201 are turned off, the current is cut off since a series circuit of the diodes 300, 301 and 302 or a series circuit of the diodes 303, 304 and 305 includes ones of opposite polarities. When the terminal at which the anode of the diode 300 and the cathode of the diode 303 are connected together is at a higher potential than is the other terminal of the solid-state switch 100, the diode 303 functions as a reverse breakdown voltage protective diode for the gate turn-off thyristor 200, and the diode 301 functions as a reverse breakdown voltage protective diode for the gate turn-off thyristor 201. When the terminal at which the cathode of the diode 302 and the anode of the diode 305 are connected together is at a higher potential than is the other terminal of the solid-state switch 100, the diode 302 functions as a reverse breakdown voltage protective diode for the gate turn-off thyristor 201, and the diode 304 functions as a reverse breakdown voltage protective diode for the gate turn-off thyristor 200.

It is assumed that in FIG. 1 the set voltages across the gate turn-off thyristors 200, 201 in the off-state are represented by e (V). Since the gate turn-off thyristors 200 and 201 in FIG. 1 are equivalently connected in series, the breakdown voltage of the solid-state switch can be set to 2e (V). At this time, the set voltages across the diodes 300, 302, 303 and 305 are equally e (V), and the set voltages across the diodes 301 and 304 are equal to 2e (V). Thus, the reverse breakdown voltage of the diodes 300, 302, 303, 305 may be selected to be e (V) or above, and that of the diodes 301, 304 may be selected to be 2e (V) or above. Therefore, the breakdown voltage of the solid-state switch in the off-state can be made equal to that determined by the set voltage and number of gate turn-off thyristors used.

FIGS. 2 and 3 respectively show the circuit arrangements of conventional solid-state switches 101, 102 having the same breakdown voltage as in FIG. 1. In FIG. 2, a series circuit of two reverse breakdown protective diodes 300 and two gate turn-off thyristors 200 which are connected in the forward direction is connected in parallel with a series circuit of the same elements which are connected in the reverse direction. From FIGS. 1A and 2, it will be seen that the number of gate turn-off thyristors used in the solid-state switch 100 of the invention is ½ that of the conventional example 1. In FIG. 3, a bridge circuit formed of four diodes 300 for reverse breakdown voltage protection and one gate turn-off thyristor 200 connected at the center is connected in series with a bridge circuit of the same elements. From FIGS. 1 and 3, it will be seen that the number of diodes used in the solid-state switch 100 of the invention is two ones less than that of the conventional example 2, or that the watt loss in the invention is smaller because the number of semiconductor elements in which current flow therethrough is smaller than the conventional example.

The diodes 300 and 305 in FIG. 1 may be omitted because they do not function as reverse breakdown voltage protective diodes. In the case in which the diode 300 is excluded, in order not to change the breakdown voltage between the terminals, it is preferable to use the diode 302 of reverse voltage more than 2e [V]. Similarly, in case that the diode 305 is omitted, it is preferable to use the diode 305 of reverse voltage more than 2e [V].

FIG. 4 shows a solid-state switch 110 of another embodiment of the invention, in which three gate turn-off thyristors are connected equivalently in series. It is assumed that the set, or breakdown voltage of each gate turn-off thyristor 210, 211, 212 in the off-state is represented by e (V). If the reverse breakdown voltage of the diode 310, 313, 314, 317 is selected to be e (V) or above, and if that of the diodes 311, 312, 315, 316 is selected to be 2e (V) or above, the breakdown voltage of this solid-state switch in the off-state can be set to 3e (V) or above. When the gate turn-off thyristors 210, 211, 212 are turned on so that the solid-state switch 110 becomes in the on-state, the alternating current I flows, in one direction, in the circuit of diode 310, gate turn-off thyristor 210, diode 315, gate turn-off thyristor 211, diode 312, gate turn-off thyristor 212 and diode 317, and, in the reverse direction, flows in the circuit of diode 313, gate turn-off thyristor 212, diode 316, gate turn-off thyristor 211, diode 311, gate turn-off thyristor 210 and diode 314.

Figure 5:
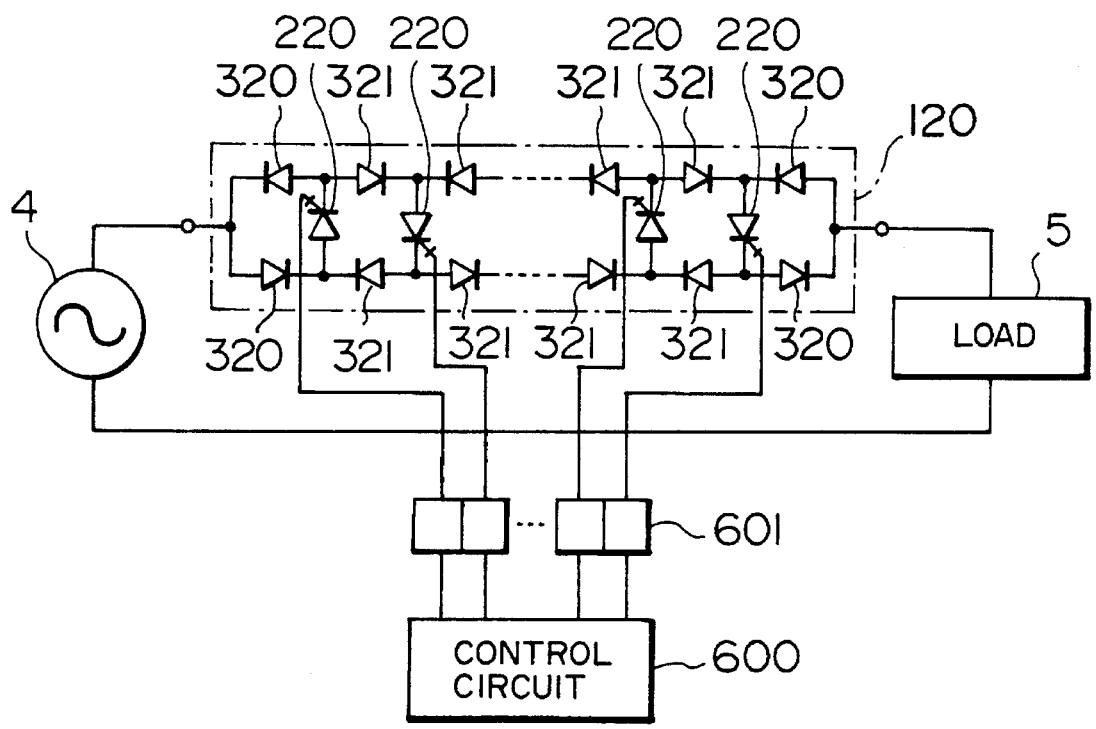
FIG. 5 is a diagram of the arrangement of a solid-state switch equivalent to the series connection of n gate turn-off thyristors as still another embodiment of the invention.

Similarly, as the number of gate turn-off thyristors is increased to raise the breakdown voltage of the solid-state switch in the off-state, the circuit arrangement, as shown in FIG. 5, can be realized as a solid-state switch 120. If n gate turn-off thyristors 220 are used of which the set, or breakdown voltage is e (V) in the off-state, a solid-state switch of which the breakdown voltage is ne (V) in the off-state can be formed by those thyristors, four diodes 320 of breakdown voltage, e (V) and 2n–2 diodes 321 of reverse breakdown voltage, 2e (V) or above.

When the solid-state switch of the above arrangement is used, drive circuits 601 and a control circuit 600 are added as shown in FIG. 5 in order that the voltages across the gate turn-off thyristors can be prevented from being transiently unbalanced to be too large when the respective turn-off thyristors are turned on and off. In this case, the control circuit 600 controls the drive circuits 601 so that the on-off operations of the gate turn-off thyristors can be synchronized to make a single switch operation.

FIG. 6 shows a table of the number of gate turn-off thyristors used, the number of diodes used and the loss for a solid-state switch of the invention and conventional ones. Each of the switches has an equal breakdown voltage, ne (V) in the off-state, and each of the gate turn-off thyristors used has an equal set, or breakdown voltage e (V), or an equal voltage is developed across each of the thyristors. In the solid-state switch of the invention, the number of necessary gate turn-off thyristors is n, and the number of necessary diodes is 2n+2. In addition, the watt loss is 2n+2 if the loss per semiconductor device is 1. In the conventional example 1, or in a solid-state switch having the forward current arm and the reverse current arm connected in a reverse-parallel configuration, the number of gate turn-off thyristors is 2n, the number of diodes is 2n, and the watt loss is 2n. Thus, in this invention, the number of relatively expensive gate turn-off thyristors is ½ that of the conventional switch, and the number of diodes and watt loss are the same as those in the conventional switch. In the conventional example 2, or a solid-state switch having gate turn-off thyristors combined with diode bridges, the number of gate turn-off thyristors is n, the number of diodes is 4n, and the watt loss is 3n. Thus, in this invention, the number of thyristors is the same as that in the conventional example 2, the number of diodes is about ½ and the watt loss is about ⅔, as low as those in the conventional example 2.

Therefore, according to the above embodiment of the invention, the number of gate turn-off thyristors used is not larger than the number of series-connected thyristors which is determined by the breakdown voltage of the solid-state switch in the off-state and by the set voltage developed across each of the gate turn-off thyristors. In addition, the number of reverse breakdown voltage protective diodes for gate turn-off thyristors is as small as about 2 for each gate turn-off thyristor, and the watt loss is small. Since the number of gate turn-off thyristors used is ½ that in the prior art, the number of drive circuits necessary for the gate turn-off thyristors is also ½ that in the prior art. Therefore, the solid-state switch of the invention can be small-sized, simplified and produced at low cost. Moreover, as the number of gate turn-off thyristors is increased for producing a solid-state switch which can withstand a higher voltage, the solid-state switch becomes the more easy to control. Since the number of diodes used is small, the solid-state switch can be small-sized, simplified and produced at low cost. Also, the watt loss in the semiconductor devices can be reduced. Since the watt loss is small, the cooler for the semiconductor devices can be small-sized, and the solid-state switch can be small-sized and simplified.

Figure 7:
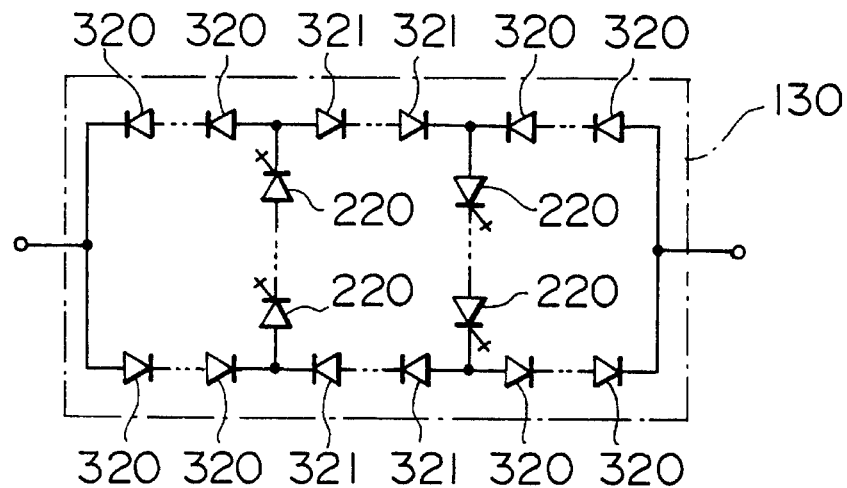
FIG. 7 is a diagram of the arrangement of a solid-state switch having a series circuit of semiconductor devices in each branch as still another embodiment of the invention.

FIG. 7 shows a modification of the solid-state switch of the embodiment of the invention shown in FIG. 1. As illustrated, a plurality of gate turn-off thyristors 220 are connected in series in each rung of the ladder, and a plurality of diodes 320, 321 are connected in series in each side rail. The solid-state switch, 130 of this embodiment is formed of groups of series of gate turn-off thyristors 220, and series of diodes 320, 321. According to this embodiment, the solid-state switch is able to withstand higher voltages.

Figure 8:
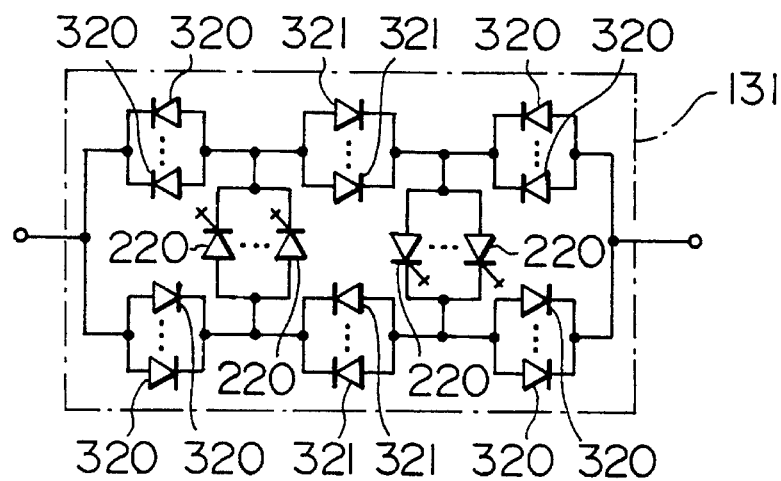
FIG. 8 is a diagram of the arrangement of a solid-state switch having a parallel circuit of semiconductor devices in each branch as still another embodiment of the invention.

FIG. 8 shows a modification of the solid-state switch of the embodiment of the invention shown in FIG. 1. As illustrated, a plurality of gate turn-off thyristors are connected in parallel in each rung of the ladder, and a plurality of diodes are connected in parallel in each side rail. The solid-state switch, 131 of this embodiment is formed of groups of parallel circuits of gate turn-off diodes 220, and parallel circuits of diodes 320, 321. According to this embodiment, the solid-state switch is able to increase the current capacity. In this embodiment, parallel circuits of semiconductor devices may be connected in a part of the branches, or the rung and side rails, for example, a parallel circuit of gate turn-off thyristors 220 may be connected in each of the rungs of the ladder.

Moreover, parallel and series circuits of gate turn-off thyristors or diodes may be connected in each branch, or the rungs and side rails of the solid-state switch of the invention. Thus, the solid-state switch of the invention can withstand much higher voltages and have a much larger current capacity.

Figure 9:
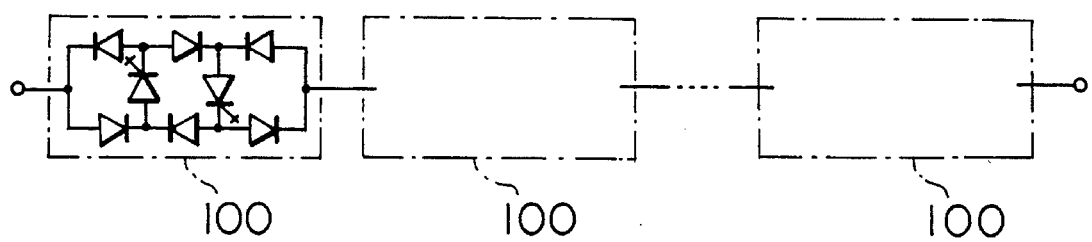
FIG. 9 is a diagram of the arrangement of a solid-state switch having a series circuit of basic solid-state switches as still another embodiment of the invention.

FIG. 9 shows a solid-state switch having a plurality of solid-state switches 100, each of which is the basic structure of the invention as shown in FIG. 1, connected in series so as to totally have a high breakdown voltage. When the number of semiconductor devices used becomes very large or when a solid-state switch is difficult to construct with a simple arrangement as in the solid-state switch 120 shown in FIG. 5 because of the limit of the circuit arrangement, the breakdown voltage of the solid-state switch can be increased by this series connection of switches 100. In this case, however, the voltage across each solid-state switch must be set not to exceed the breakdown voltage in the off-state. If this condition is satisfied, the numbers of semiconductor devices such as gate turn-off thyristors and diodes used in the respective solid-state switches 100 may be different from each other, and two or more solid-state switches of different breakdown voltages in the off-state may be connected. Therefore, the freedom in the design of the solid-state switch can be increased. In place of the solid-state switch 100, the solid-state switches 110, 120 may be used for equivalent functions.

Figure 10:
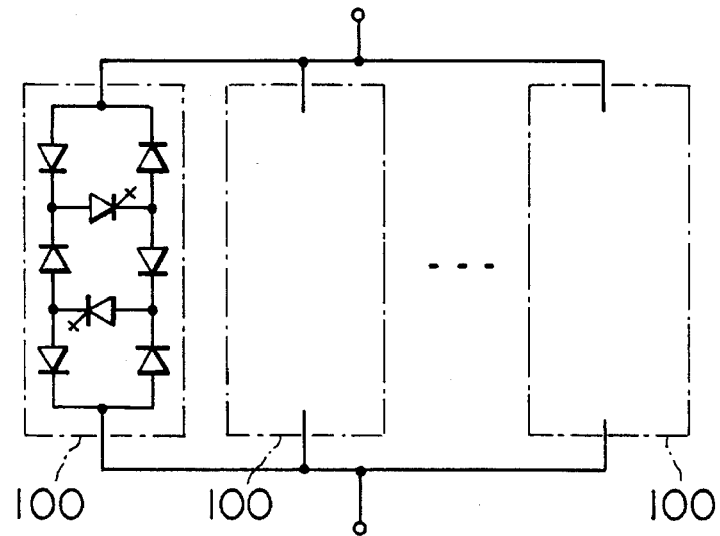
FIG. 10 is a diagram of the arrangement of a solid-state switch having a parallel circuit of basic solid-state switches as still another embodiment of the invention.

FIG. 10 shows a solid-state switch having a plurality of solid-state switches 100, each of which is the basic arrangement of the invention, connected in parallel so as to totally increase the current capacity. Since the current capacity of a single solid-state switch is limited by that of gate turn-off thyristors or diodes used in the switch, a parallel connection of solid-state switches of the invention can increase the current capacity. At this time, the current flowed in each solid-state switch must be set not to exceed the limit of the current capacity of each switch. If this condition is satisfied, the shunt currents in the solid-state switches 100 connected in parallel may be different in their values, and two or more solid-state switches of different current capacities may be connected. Therefore, the freedom in the design of the solid-state switch can be increased. In place of the solid-state switches 100, the solid-state switches 110, 120 may be connected for equivalent functions.

Moreover, solid-state switches each of which has the solid-state switches 100 connected in series as shown in FIG. 9 may be connected in parallel so as to increase the current capacity. Also, solid-state switches each of which has the solid-state switches 100 connected in parallel as shown in FIG. 10 may be connected in series so as to increase the breakdown voltage. Therefore, a solid-state switch having a high breakdown voltage and a large current capacity can be produced.

Figure 11:
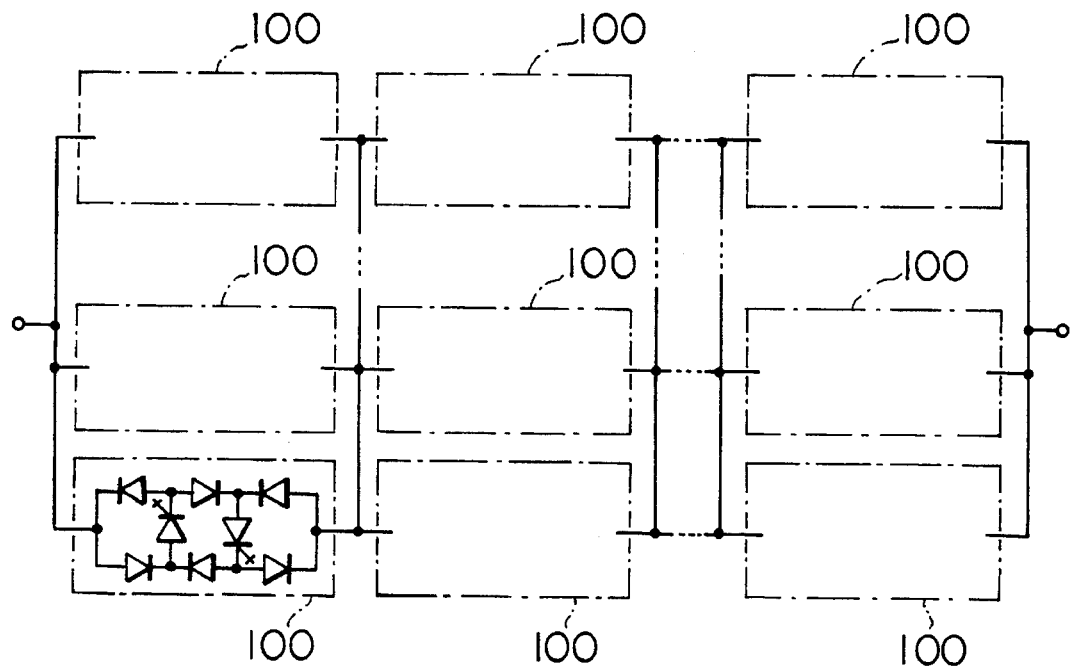
FIG. 11 is a diagram of the arrangement of a solid-state switch having a parallel circuit of basic solid-state switches connected in series as still another embodiment of the invention.

In addition, as shown in FIG. 11, solid-state switches 100 each of which is the basic arrangement of the invention as shown in FIG. 1 can be connected in series and in parallel. Therefore, a solid-state switch having a higher breakdown voltage and a larger current capacity can be produced. At this time, the voltage across and current in each switch 100 must be set not to exceed the breakdown voltage and current capacity of each switch. Thus, a solid-state switch having a high breakdown voltage and a large current capacity can be produced. In place of the solid-state switch 100, the solid-state switch 110, 120 can be used to construct equivalent functions.

Figure 12:
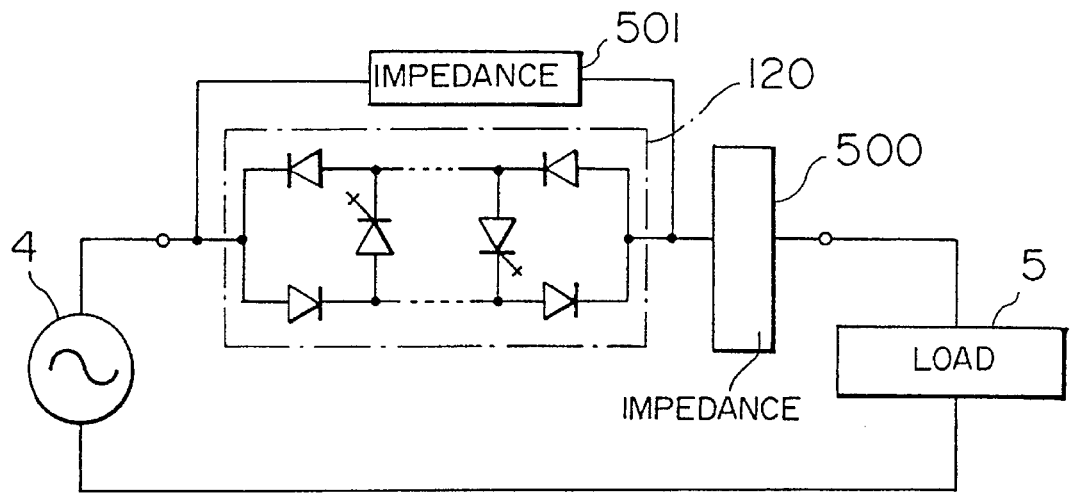
FIG. 12 is a diagram of the arrangement of a solid-state switch having impedance elements connected to basic solid-state switches as still another embodiment of the invention.

As one of the switch functions, an impedance is sometimes connected in a circuit and disconnected from the circuit. FIG. 12 shows an example of the impedance connection. As illustrated, an impedance 500 is connected in series with the solid-state switch 120 or an impedance 501 is connected in parallel with the switch 120. In this case, an impedance is connected to or disconnected from one solid-state switch when the solid-state switch is turned on or off.

However, if the impedance is controlled to be connected and disconnected at a high speed, a current flowing in a circuit, such as a fault current in a system can be adjusted or regulated, or current control can be made, by the on-off operation of the solid-state switch. Also, a large current such as an inrush current, which is flowed when a transformer or capacitor is connected, can be effectively suppressed by increasing the impedance only when a large current is flowed.

Figure 13:
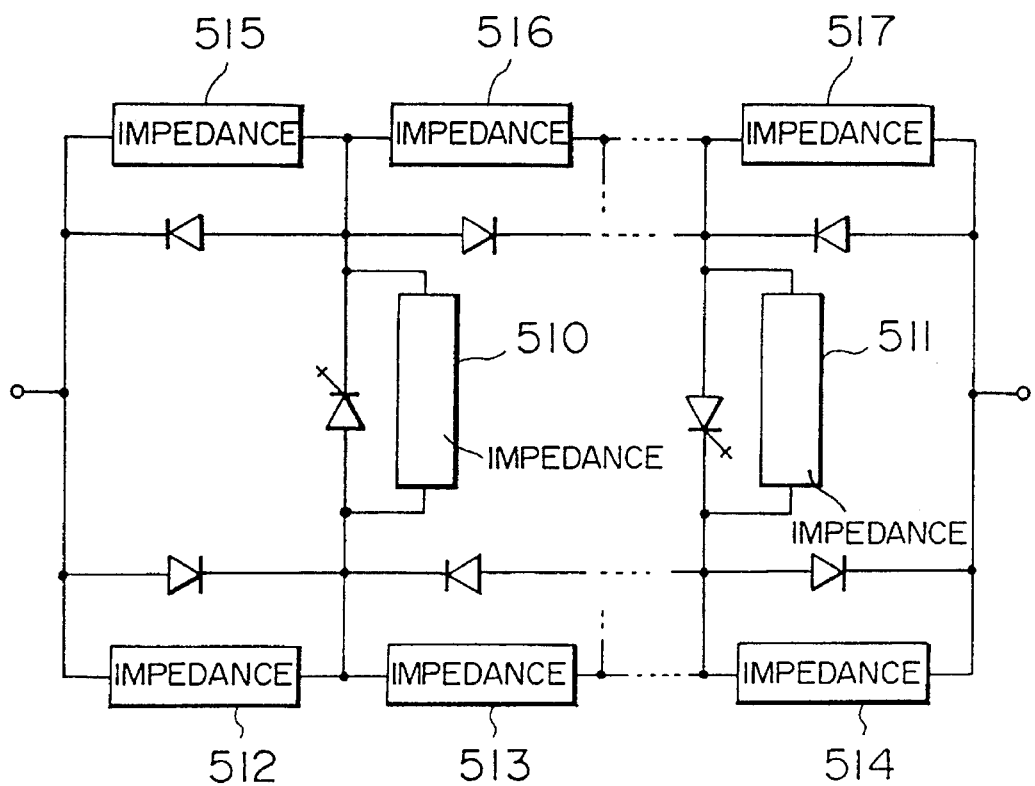
FIG. 13 is a diagram of the arrangement of a solid-state switch having impedance elements each 10 connected in parallel to each of the semiconductor devices of basic solid-state switches as still another embodiment of the invention.

Moreover, as shown in FIG. 13, arbitrary impedance elements 510 through 517 can be respectively connected in parallel to the semiconductor devices which constitute the solid-state switch. If only the impedance elements 510, 511 are respectively connected in parallel with gate turn-off thyristors, the thyristors connected in parallel with the impedance elements, when turned on or off, make equivalently the impedance elements be bypassed or connected in the circuits. Thus, the impedance can be variably controlled.

Figure 14:
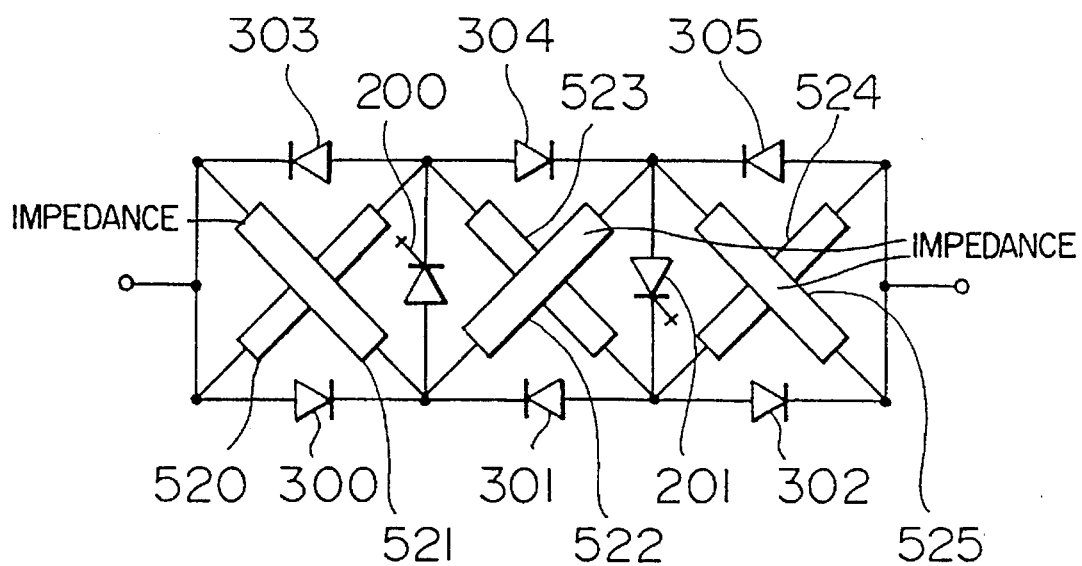
FIG. 14 is a diagram of the arrangement of a solid-state switch having impedance elements connected crosswise in each section of a basic solid-state switch as still another embodiment.

Also, as shown in FIG. 14, arbitrary impedance 520, 521, 522, 523, 524,525 can be connected between the anode of a gate turn-off thyristor and the cathode of the diode which is connected to the cathode of the gate turn-off thyristor (for example, between the anode of the gate turn-off thyristor 200 and the cathode of the diode 303 or 304) or between the cathode of a gate turn-off thyristor and the anode of a diode which is connected to the anode of the gate turn-off thyristor (for example, between the cathode of the gate turn-off thyristor 200 and the anode of the diode 300 or 301). In this figure, two gate turn-off thyristors are used. In this case, if the impedance elements 520, 523 and 524 are connected as illustrated, currents are made to flow in the semiconductor devices and the impedance elements in accordance with the turning ON and OFF on the gate turn-off thyristors 200 and 201. Therefore, the currents flowing therein can be precisely controlled by the impedance elements.

Figure 15:
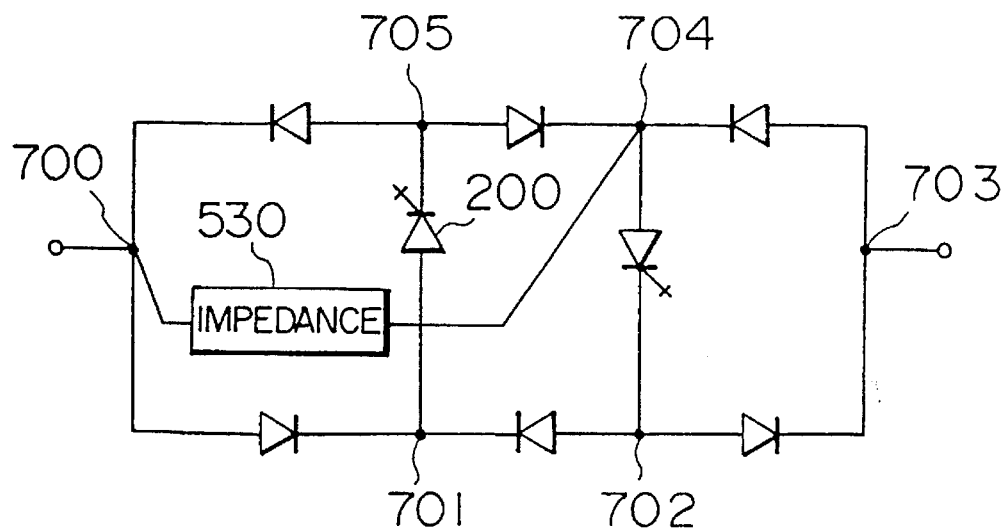
FIG. 15 is a diagram showing that an impedance element can be connected in the basic solid-state switch.

Furthermore, as shown in FIG. 15, an impedance can be connected between two arbitrary ones of the nodes 700 through 705 between which the semiconductor devices are connected to form the basic solid-state switch of the invention shown in FIG. 1. For example, the impedance 530 can be connected between the nodes 700 and 704. The impedance 530 is disconnected from or connected in the circuit when the gate turn-off thyristor 200 is turned on or off.

Thus, an arbitrary impedance can be connected in the solid-state switch of the invention, thereby making impedance control. As the solid-state switch includes a larger number of gate turn-off thyristors and a larger number of on/off combinations of gate turn-off thyristors, the degree of impedance change increases the more. If the on/off operation of one gate turn-off thyristor makes it possible to turn one impedance on and off, n gate turn-off thyristors make it possible to turn n different impedance elements on and off. Therefore, the number of different impedance values to be taken is n-th power of 2, and hence precise, or fine control is possible.

These ways to connect impedance elements can be used in the various different solid-state switches mentioned above. When the solid-state switch of the invention is used to function as a variable impedance, each of the gate turn-off thyristors must be turned on and off without overvoltage thereacross. In addition, of the gate turn-off thyristors, ones to be turned on and the ones to be turned off are properly selected to have desired impedance or current. Thus, on the basis of this selection, the impedance control is made by the values of impedance elements and the on/off combinations of the gate turn-off thyristors.

Figure 16:
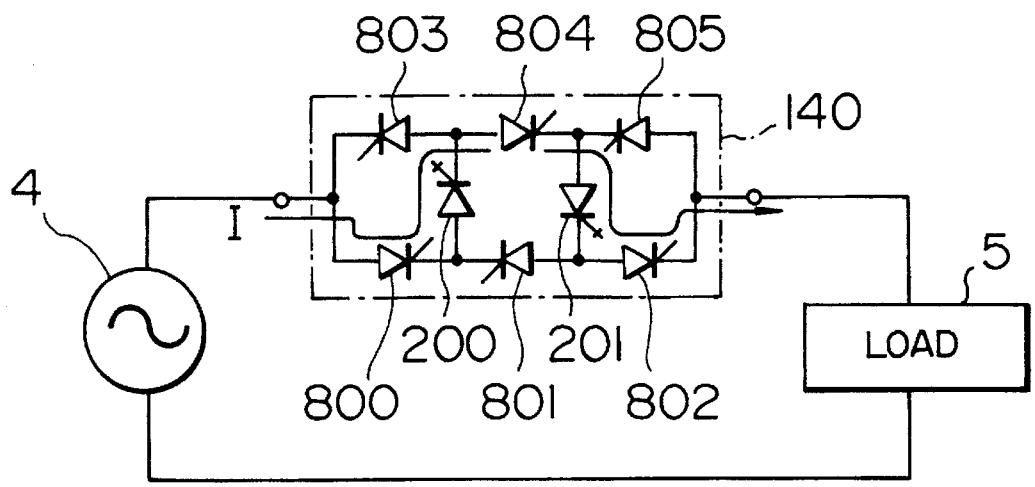
FIG. 16 is a diagram of the arrangement of a modification of the basic solid-state switch, showing that the basic solid-state switch is formed of gate turn-off thyristors and thyristors.

FIG. 16 shows another basic solid-state switch 140, which is equivalent to the use of thyristors in place of the diodes in the basic solid-state switch 100 of the invention having gate turn-off thyristors and diodes shown in FIG. 1. In other words, thyristors 800 through 805 are used in place of the diodes 300 through 305. When this solid-state switch is turned on by making the gate turn-off thyristors 200, 201 and thyristors 800 through 805 conductive, the alternating current I is flowed alternately in the circuit of thyristor 800, gate turn-off thyristor 200, thyristor 804, gate turn-off thyristor 201 and thyristor 802 and in the circuit of thyristor 805, gate turn-off thyristor 201, thyristor 801, gate turn-off 200 and thyristor 803. In this circuit arrangement, the thyristors 800 through 805 operate like the diodes in the solid-state switch 100 so that they serve as the semiconductor devices for protecting the gate turn-off thyristors from the reverse breakdown voltage. When the gate turn-off thyristors 200, 201 are turned off to make the solid-state switch 140 in the off-state, current is stopped from flowing from thyristor 800 to thyristor 802 since the thyristors 801, 803, 805 are reverse-biased to be off, or the thyristors 800, 802, 804 are naturally turned off. When an alternating current is flowed in the switch, a reverse current is flowed so that the thyristors 800, 802, 804 are reverse-biased to be off. In other words, the thyristors 800 through 805 can be turned off without particular turn-off circuits. This solid-state switch 140 has the following effect in addition to the same effect as that of the solid-state switch 100 shown in FIG. 1. When the voltages across the gate turn-off thyristors 200, 201 is set to be e (V), the solid-state switch shown in FIG. 16 is equivalent to a solid-state switch having two gate turn-off thyristors connected in series, or has a breakdown voltage of 2e (V) provided that the forward and reverse breakdown voltages of the thyristors 800 through 805 are e (V) or above. In the solid-state switch 100 having gate turn-off thyristors and diodes as shown in FIG. 1, the voltage across the diodes is set to be one of two different values e (V) and 2e (V) above, while in the arrangement shown in FIG. 16, the voltage across each of all the thyristors can be set to be equal because the forward and reverse breakdown voltages of the thyristors are equal.

Figure 17:
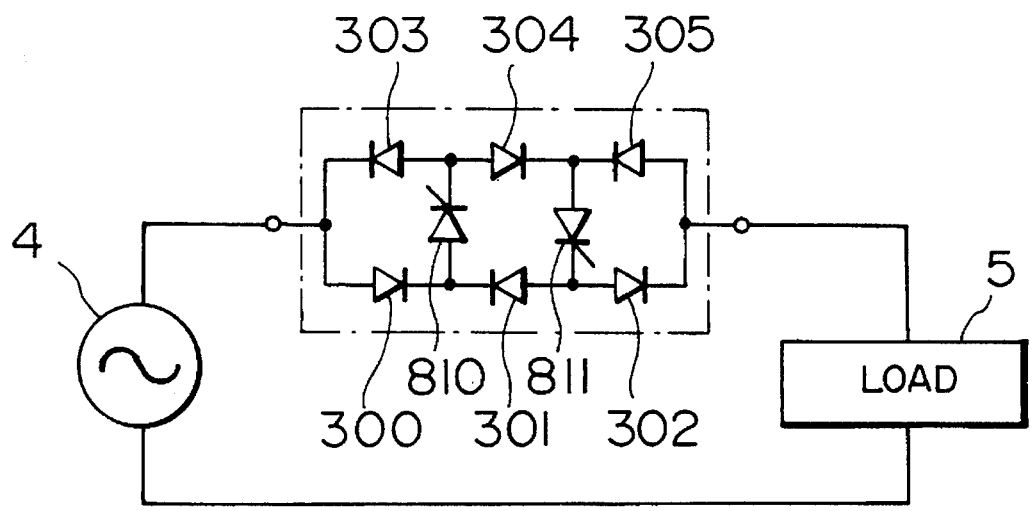
FIG. 17 is a diagram of the arrangement of another modification of the basic solid-state switch, showing that the basic solid-state switch is formed of thyristors and diodes.

FIG. 17 shows another basic solid-state switch 150 which is equivalent to the use of thyristors 810, 811 in place of gate turn-off thyristors in the basic solid-state switch 100 of the invention having gate turn-off thyristors and diodes as shown in FIG. 1. This circuit arrangement is equivalent to a solid-state switch having the reverse-parallel connection of two series-connected thyristors of breakdown voltage e (V) so that an AC current can be controlled. This circuit arrangement may have ½ the number of thyristors of the reverse-parallel connection type. Therefore, this solid-state switch of FIG. 17 can be produced at low cost because the thyristor is expensive as compared with the diode.

The arrangement of gate turn-off thyristors and thyristors and the arrangement of thyristors and diodes as shown in FIGS. 16 and 17 can be applied to all the structures of solid-state switches having gate turn-off thyristors and diodes mentioned above.

The solid-state switches of the invention mentioned above are the general type switches capable of AC current flow and cut-off, and thus can be used in DC circuits. Therefore, they can be used as the switches not only in the electric machinery and apparatus (inverters, converters, choppers and so on) using semiconductor switches but also in the other electrical circuits and apparatus such as solid-state circuit breakers or, more generally, referred to as switch gears, high-speed AC switches and impedance controllers. When this invention is used, the arrangement of semiconductor devices can be changed in accordance with the breakdown voltages and current capacity necessary for the circuits, and hence a solid-state switch suitable for the circuits can be constructed with ease.

According to the embodiments of the invention mentioned above, when large-capacity semiconductor devices such as gate turn-off thyristors are used in, for example, power systems, the number of gate turn-off thyristors, diodes and so on can be decreased and the same switching capability can be maintained as compared with the conventional AC semiconductor switches. Also, the watt loss in the semiconductor devices of the invention is equal to or less than that of the conventional switch. In addition, the number of semiconductors used, particularly the number of gate turn-off thyristors can be decreased to that determined by the breakdown voltage of the solid-state switch in the off-state and by the set voltage across each gate turn-off thyristor. Therefore, the solid-state switch of the invention is economical since the gate turn-off thyristor is several times expensive as compared with the diode of the same capacity. Moreover, since the number of gate drive circuits necessary to control the gate turn-off thyristors can be decreased in proportion to the reduction of the number of gate turn-off thyristors, the solid-state switch of the invention can be small-sized and simplified in construction. Also, since the gate turn-off thyristors must be turned on and off in synchronism with each other so that overvoltages are not applied to the gate turn-off thyristors, the reduction of the number of gate turn-off thyristors constituting the solid-state switch can improve the controllability of the solid-state switch. In addition, if impedance elements are connected in the solid-state switch of the invention and control the gate turn-off thyristors to separately turn on and off, the variable impedance control can be precisely or finely made at a high speed. In this invention, since the number of gate turn-off thyristors connected is not limited from the circuit arrangement point of view, the number of necessary semiconductor devices is determined from the breakdown voltage and current capacity of the semiconductor devices in the off-state and the breakdown voltage of the solid-state switch in the off-state can be increased. Also, a large-capacity solid-state switch can be constructed by series or parallel connection of basic solid-state switches of the invention.

We claim:

1. A solid-state switch of a ladder circuit type connected between a power source for providing bidirectional current flow and a load comprising a first terminal disposed on a first rung of said ladder, having a plurality of rungs, and connected to said power source; a second terminal disposed on a (N+2)th rung of said ladder and connected to said load; a plurality of gate turn-off thyristors, each having first and second conduction-type electrodes; and a plurality of diodes each having first and second conduction-type electrodes, wherein:

a first gate turn-off thyristor is disposed on a second rung of said ladder;

a (n−1)th gate turn-off thyristor is disposed on a (n)th rung of said ladder and is identified with said first gate turn-off thyristor in a case in which n=2;

a {(n−1)x2−1}th diode is connected to said second conduction-type electrode of said (n−1)th gate turn-off thyristor, and is disposed on a (n)th branch of a first side rail of said ladder in a case in which n is an even number and is disposed on a (n)th branch of a second side rail of said ladder in a case in which n is an odd number;

a {(n−1)x2}th diode is connected to said first conduction-type electrode of said (n−1)th gate turn-off thyristor, and is disposed on a (n)th branch of said second side rail of said ladder in case in which n is an even number and is disposed on a (n)th branch of said first side rail of said ladder in a case in which n is an odd number;

a (n)th gate turn-off thyristor of which said first conduction-type electrode is connected to said second conduction-type electrode of said (n−1)th gate turn-off thyristor through said {(n−1)x2−1}th diode, of which said second conduction-type electrode is connected to said first conduction-type electrode of said (n−1)th gate turn-off thyristor through said {(n−1)x2}th diode, and is disposed on a (n+1)th rung of said ladder;

a (N)th gate turn-off thyristor is disposed on a (N+1)th rung of said ladder and is identified with said (n)th gate turn-off thyristor in a case in which n=N;

a source side diode disposed on a first branch of said second side rail of said ladder and of which said second conduction-type electrode is connected to said first terminal and said first conduction-type electrode is connected to said second conduction-type electrode of said first gate turn-off thyristor; and a load side diode of which said first conduction-type electrode is connected to said second conduction-type electrode of said (N)th gate turn-off thyristor, of which said second conduction-type electrode is connected to said load, and which is disposed on a (N+1)th branch of said second side rail of said ladder in a case in which N is an even number and is disposed on a (N+1)th branch of said first side rail of said ladder in a case in which N is an odd number, where N is a positive integer greater than or equal to 2 and is indicative of the number of gate turn-off thyristors in said plurality of thyristors, and where n is an integer inclusive of all integers within a range of 2 to N.

2. A solid-state switch according to claim 1, wherein AC current flows alternately through a path in an order of said first gate turn-off thyristor, said (n−1)th gate turn-off thyristor, said {2x(n−1)−1}th diode, said (n)th gate turn-off thyristor, said (N)th gate turn-off thyristor and said load side diode, and through a path in an order of said (N)th gate turn-off thyristor, said (n)th gate turn-off thyristor, said {2x(n−1)}th diode, said (n−1)th gate turn-off thyristor, said first gate turn-off thyristor and said source side diode.

3. A solid-state switch according to claim 1, wherein N, is equal to 2.

4. A solid-state switch according to claim 1, wherein N, is equal to 3.

5. A solid-state switch according to claim 1, wherein each of said gate turn-off thyristors has a forward off-state breakdown voltage e (V), said diodes connected between said gate turn-off thyristors adjacent to said first and second terminals and said first and second terminals have a reverse breakdown voltage e (V) or above, respectively, and said diodes connected between said adjacent gate turn-off thyristors have a reverse breakdown voltage 2e (V) or above, respectively.

6. A solid-state switch according to claim 1, wherein said gate turn-off thyristors or said diodes are connected with snubber circuits for protecting said devices.

7. A solid-state switch according to claim 1, wherein a synchronous controller is provided to synchronously control said gate turn-off thyristors to be turned on and off without causing an unbalanced ratio among the set voltages thereacross.

8. A solid-state switch according to claim 1, wherein an impedance element is connected in series or in parallel with said solid-state switch.

9. A solid-state switch according to claim 1, wherein said gate turn-off thyristors or said diodes have impedance elements connected in parallel.

10. A solid-state switch according to claim 1, wherein at least one impedance element is connected between said first conduction-type electrodes of said adjacent gate turn-off thyristors, between said second conduction-type electrodes thereof or between said first conduction-type electrode or said second conduction-type electrode of each of said gate turn-off thyristors adjacent to said first and second terminals and the corresponding one of said first and second terminals.

11. A solid-state switch according to claim 1, wherein impedance elements are respectively connected between said first conduction type electrodes of said adjacent gate turn-off thyristors, between said second conduction-type electrodes thereof, between said first conduction-type electrode of each of said gate turn-off thyristors adjacent to said first and second terminals and the corresponding on of said first and second terminals and between said second conduction-type electrode of each of said gate turn-off thyristors adjacent to said first and second terminals and the corresponding one of said first and second terminals.

12. A solid-state switch according to claim 1, wherein impedance elements are connected between said first conduction type electrodes of said adjacent gate turn-off thyristors and between said first conduction-type electrode of each of said gate turn-off thyristors adjacent to said first and second terminals and the corresponding one of said first and second terminals.

13. A solid-state switch according to claim 1, wherein impedance elements are connected between said second conduction-type electrodes of said adjacent gate turn-off thyristors and between said second conduction-type electrode of each of said gate turn-off thyristors adjacent to said first and second terminals and the corresponding one of said first and second terminals.

14. A solid-state switch according to claim 1, wherein said gate turn-off thyristors can be independently controlled to turn on and off so that no over-voltage is applied to said gate turn-off thyristors or said diodes.

15. A circuit breaker comprising a solid-state switch provided in its current interrupting portion, wherein a solid-state switch according to claim 1 is used as said solid-state switch.

16. A switch gear comprising a solid-state switch provided in its switching portion, wherein a solid-state switch according to claim 1 is used as said solid-state switch.

17. A static switch formed of a solid-state switch, wherein a solid-state switch according to claim 1 is used as said solid-state switch.

18. A solid-state switch of a ladder circuit type connected between a power source for providing bidirectional current flow and a load comprising a first terminal disposed on a first rung of said ladder, having a plurality of rungs, and connected to said power source; a second terminal disposed on a (N+2)th rung of said ladder and connected to said load; a plurality of controllable semiconductor devices each including a first conduction-type electrode, a second conduction-type electrode and a control electrode for controlling current flowing between said first and second conduction-type electrodes; and a plurality of protection semiconductor devices each having first and second conduction-type electrodes, wherein:

a first controllable semiconductor device is disposed on a second rung of said ladder;

a (n−1)th controllable semiconductor device is disposed on a (n)th rung of said ladder and is identified with said first controllable semiconductor device in a case in which n=2;

a {(n−1)x2−1}th protection semiconductor device, used for a protection from a reverse voltage, is connected to said second conduction-type electrode of said (n−1)th controllable semiconductor device, and is disposed on a (n)th branch of a first side rail of said ladder in a case in which n is an even number and is disposed on a (n)th branch of a second side rail of said ladder in a case in which n is an odd number;

a {(n−1)x2}th protection semiconductor device, used for a protection from a reverse voltage, is connected to said first conduction-type electrode of said (n−1)th controllable semiconductor device, and is disposed on a (n)th branch of said second side rail of said ladder in a case in which n is an even number and is disposed on a (n)th branch of said first side rail of said ladder in a case in which n is an odd number;

a (n)th controllable semiconductor device of which said first conduction-type electrode is connected to said second conduction-type electrode of said (n−1)th controllable semiconductor device through said {(n−1)x2−1}th protection semiconductor device, of which said second conduction-type electrode is connected to said first conduction-type electrode of said (n−1)th controllable semiconductor device through said {(n−1)x2}th protection semiconductor device, and is disposed on a (n+1)th rung of said ladder;

a (N)th controllable semiconductor device is disposed on a (N+1)th rung of said ladder and is identified with said (n)th controllable semiconductor device in a case in which n=N;

a source side diode is disposed on a first branch of said second side rail of said ladder and of which said second conduction-type electrode is connected to said first terminal and said first conduction-type electrode is connected to said second conduction-type electrode of said first controllable semiconductor device; and a load side protection semiconductor device of which said first conduction-type electrode is connected to said second conduction-type electrode of said (N)th controllable semiconductor device, of which said second conduction-type electrode is connected to said load, and which is disposed on a (N+1)th branch of said second side rail of said ladder in a case in which N is an even number and is disposed on a (N+1)th branch of said first side rail of said ladder in a case in which N is an odd number, where N is a positive integer greater than or equal to 2 and is indicative of the number of controllable semiconductor devices included in said plurality of controllable semiconductor devices, and where n is an integer inclusive of all integers within a range of 2 to N.

19. A solid-state switch according to claim 18, wherein bidirectional current flows alternately through a path in an order of said first controllable semiconductor device, said (n−1)th controllable semiconductor device, said {2x(n−1)−1}th protection semiconductor device, said (n)th controllable semiconductor device, said (N)th controllable semiconductor device and said load side protection semiconductor device, and through a path in an order of said (N)th controllable semiconductor device, said (n)th controllable semiconductor device, said {2x(n−1)}th protection semiconductor device, said (n−1)th controllable semiconductor device, said first controllable semiconductor device and said source side protection semiconductor device.

20. A solid-state switch according to claim 18, wherein said (n)th controllable semiconductor device includes a gate turn-off thyristor.

21. A solid-state switch according to claim 18, wherein at least one of said protection semiconductor devices includes a diode.

22. A solid-state switch according to claim 18, wherein at least one of said protection semiconductor devices includes a thyristor.

23. A solid-state switch connected between a power source for providing bidirectional current flow and a load comprising a plurality of switching units arranged as a multi-unit ladder circuit type, each of said switching units comprising a first terminal disposed on a first rung of said ladder, having a plurality of rungs, and connected to said power source; a second terminal disposed on a (N+2)th rung of said ladder and connected to said load; a plurality of controllable semiconductor devices each including a first conduction-type electrode, a second conduction-type electrode and a control electrode for controlling current flowing between said first and second conduction-type electrodes; and a plurality of protection semiconductor devices each having first and second conduction-type electrodes, wherein:

a first controllable semiconductor device is disposed on a second rung of said ladder;

a (n−1) th controllable semiconductor device is disposed on a (n)th rung of said ladder and is identified with said first controllable semiconductor device in a case in which n=2;

a {(n−1)x2−1}th protection semiconductor device, used for a protection from a reverse voltage, is connected to said second conduction-type electrode of said (n−1)th controllable semiconductor device, and is disposed on a (n)th branch of a first side rail of said ladder in a case in which n is an even number and is disposed on a (n)th branch of a second side rail of said ladder in a case in which n is an odd number;

a {(n−1)x2}th protection semiconductor device, used for a protection from a reverse voltage, is connected to said first conduction-type electrode of said (n−1)th controllable semiconductor device, and is disposed on a (n)th branch of said second side rail of said ladder in a case in which n is an even number and is disposed on a (n)th branch of said first side rail of said ladder in a case in which n is an odd number;

a (n)th controllable semiconductor device of which said first conduction-type electrode is connected to said second conduction-type electrode of said (n−1)th controllable semiconductor device through said {(n−1)x2−1}th protection semiconductor device, of which said second conduction-type electrode is connected to said first conduction-type electrode of said (n−1)th controllable semiconductor device through said {(n−1)x2}th protection semiconductor device, and is disposed on a (n+1)th rung of said ladder;

a (N)th controllable semiconductor device is disposed on a (N+1)th rung of said ladder and is identified with said (n)th controllable semiconductor device in a case in which n=N;

a source side diode is disposed on a first branch of said second side rail of said ladder and of which said second conduction-type electrode is connected to said first terminal and said first conduction-type electrode is connected to said second conduction-type electrode of said first controllable semiconductor device; and a load side protection semiconductor device of which said first conduction-type electrode is connected to said second conduction-type electrode of said (N)th controllable semiconductor device, of which said second conduction-type electrode is connected to said load, and which is disposed on a (N+1)th branch of said second side rail of said ladder in a case in which N is an even number and is disposed on a (N+1)th branch of said first side rail of said ladder in a case in which N is an odd number, where N is a positive integer greater than or equal to 2 and is indicative of the number of controllable semiconductor devices included in said plurality of controllable semiconductor devices, and where n is an integer inclusive of all integers within a range of 2 to N.

24. A solid-state switch according to claim 23, wherein bidirectional current flows in each of said switching units alternately through a path in an order of said first controllable semiconductor device, said (n−1)th controllable semiconductor device, said {2x(n−1)−1}th protection semiconductor device, said (n)th controllable semiconductor device, said (N)th controllable semiconductor device and said load side protection semiconductor device, and through a path in an order of said (N)th controllable semiconductor device, said (n)th controllable semiconductor device, said {2x(n−1)}th protection semiconductor device, said (n−1)th controllable semiconductor device, said first controllable semiconductor device and said source side protection semiconductor device.

25. A solid-state switch according to claim 23, wherein said (n)th controllable semiconductor device includes a gate turn-off thyristor.

26. A solid-state switch according to claim 23, wherein at least one of said protection semiconductor devices includes a diode.

27. A solid-state switch according to claim 23, wherein at least one of said protection semiconductor devices includes a thyristor.

28. A solid-state switch according to claim 23, wherein said plurality of switching units are arranged into at least one switching group each of which includes at least two of said switching units connected in series between said power source and said load.

29. A solid-state switch according to claim 23, wherein said plurality of switching units are arranged into at least one switching group each of which includes at least two of said switching units connected in parallel between said power source and said load.

30. A solid-state switch comprising a plurality of gate turn-off thyristors and a plurality of diodes connected thereto to effect a circuit arrangement, wherein:

said plurality of gate turn-off thyristors are connected in series;

a forward current is made to flow through a connection consisting of a first forwardly-directioned diode, a first gate turn-off thyristor, a second forwardly-directioned diode, a second gate turn-off thyristor and a third forwardly-directioned diode, in turn;

a backward current is made to flow through a connection consisting of a first reversely-directioned diode, said second gate turn-off thyristor, a second reversely-directioned diode, said first gate turn-off thyristor and a third reversely-directioned diode, in turn;

an bidirectional current is rectified by said diodes in a manner such that both the forward and backward currents flow through said first and second gate turn-off thyristors; and the number of said gate turn-off thyristors used is equal to or smaller than that determined by the breakdown voltage of said solid-state switch in the off-state and by the set voltage across each of said gate turn-off thyristors.

31. A solid-state switch comprising a plurality of gate turn-off thyristor portions and a plurality of diode portions connected thereto to effect a circuit arrangement, wherein:

said plurality of gate turn-off thyristor portions are connected in series;

a current is made to flow from the anode of a first diode portion to the cathode thereof which is directly connected to the anode of a first gate turn-off thyristor portion, from the anode of said first gate turn-off thyristor portion to the cathode thereof which is directly connected to the anode of a second diode portion, from the anode of said second diode portion to the cathode thereof which is directly connected to the anode of a second gate turn-off thyristor portion, from the anode of said second diode portion to the cathode thereof which is directly connected to the anode of a second gate turn-off thyristor portion, from the anode of a second gate turn-off thyristor portion to the cathode thereof which is directly connected to the anode of a third diode portion, and from the anode of said third diode portion to the cathode thereof, in turn; and a reversely-directioned current is made to flow from the anode of a fourth diode portion to the cathode thereof which is directly connected to the anode of said second gate turn-off thyristor portion, from the anode of said second gate turn-off thyristor portion to the cathode thereof which is directly connected to the anode of a fifth diode portion, from the anode of said fifth diode portion to the cathode thereof which is directly connected to the anode of said first gate turn-off thyristor portion, from the anode of said first gate turn-off thyristor to the cathode thereof which is directly connected to the anode of a sixth diode portion, and from the anode of said sixth diode portion to the cathode thereof, in turn.

32. A solid-state switch according to claim 31, wherein each one of said plurality of gate turn-off thyristor portions includes a single gate turn-off thyristor, and wherein each one of said diode portions includes a single diode.

33. A solid-state switch according to claim 31, wherein each one of said plurality of gate turn-off thyristor portions includes plural gate turn-off thyristors, and wherein-each one of said diode portions includes plural diodes, the plural gate turn-off thyristors within each thyristor portion being mutually connected in series or parallel, and the plural diodes within each diode portion being mutually connected in like manner to that of the gate turn-off thyristors within each thyristor portion.

* * * * *